United States Patent
Wu (10) Patent No.: US 11,934,354 B2
(45) Date of Patent: Mar. 19, 2024

(54) METHOD OF COMPRESSING AND DECOMPRESSING A FILE VIA CELLULAR AUTOMATA PRE-PROCESSING

(71) Applicant: University of Central Florida Research Foundation, Inc., Orlando, FL (US)

(72) Inventor: Annie S. Wu, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 358 days.

(21) Appl. No.: 17/302,374

(22) Filed: Apr. 30, 2021

(65) Prior Publication Data
US 2021/0342305 A1 Nov. 4, 2021

Related U.S. Application Data

(60) Provisional application No. 63/018,158, filed on Apr. 30, 2020.

(51) Int. Cl.
*H03M 7/00* (2006.01)
*G06F 16/174* (2019.01)
*H03M 7/30* (2006.01)

(52) U.S. Cl.
CPC ...... *G06F 16/1744* (2019.01); *H03M 7/3059* (2013.01); *H03M 7/3066* (2013.01); *H03M 7/6011* (2013.01); *H03M 7/3086* (2013.01)

(58) Field of Classification Search
CPC .......... G06F 16/1744; G06F 17/30371; H03M 7/3059; H03M 7/3066; H03M 7/6011; H03M 7/3086
See application file for complete search history.

(56) References Cited

U.S. PATENT DOCUMENTS

2017/0373702 A1* 12/2017 Nakao .................. G06F 16/258

OTHER PUBLICATIONS

Haukeli. Lossless data compression using cellular automata. Network and System Administration. Oslo University College. 2012: 1-101.
Albury et al., Improving File Compression Using Elementary Cellular Automata. The Thirty-Second International Florida Artificial Intelligence Research Society Conference (FLAIRS-32). 2019: 104-107.

* cited by examiner

*Primary Examiner* — Joseph J Lauture
(74) *Attorney, Agent, or Firm* — Owen G. Behrens; Smith & Hopen, P.A.

(57) ABSTRACT

A method for pre-processing files that can improve file compression rates of existing general-purpose lossless file compression algorithms, particularly for files on which traditional algorithms perform poorly. The elementary cellular automata (CA) pre-processing technique involves finding an optimal CA state that can be used to transform an original file into a format (i.e., an intermediary file) that is more amenable to compression than the original file format. This technique is applicable to multiple file types and may be used to enhance multiple compression algorithms. Evaluation on generated files, as well as samples selected from online text repositories, finds that the CA pre-processing technique improves compression rates by up to 4% and shows promising results for assisting in compressing data that typically induce worst-case behavior in standard compression algorithms.

20 Claims, 8 Drawing Sheets

| File | Original Size | bzip2 | | | | gzip | | | | xz | | | |
|---|---|---|---|---|---|---|---|---|---|---|---|---|---|
| | | %Imp. | $\Delta_{avg}$ | $\Delta_{best}$ | $T_{best}$ | %Imp. | $\Delta_{avg}$ | $\Delta_{best}$ | $T_{best}$ | %Imp. | $\Delta_{avg}$ | $\Delta_{best}$ | $T_{best}$ |
| key1 | 1,675 bytes | 100% | +0.573% | +0.990% | 21,628 | 0% | -0.444% | -0.307% | N/A | 0% | -0.557% | -0.557% | N/A |
| key2 | 1,675 bytes | 80% | +0.398% | +0.781% | 11,104 | 0% | -0.545% | -0.461% | N/A | 0% | -0.334% | -0.279% | N/A |
| key3 | 1,675 bytes | 10% | -0.246% | +0.071% | 9,686 | 0% | -0.536% | -0.383% | N/A | 0% | -0.418% | -0.279% | N/A |
| key4 | 1,675 bytes | 60% | +0.028% | +0.711% | 11,759 | 0% | -0.513% | -0.307% | N/A | 0% | -0.559% | -0.559% | N/A |
| key5 | 1,675 bytes | 100% | +0.572% | +0.919% | 10,317 | 0% | -0.545% | -0.537% | N/A | 0% | -0.306% | -0.279% | N/A |
| key6 | 1,675 bytes | 50% | +0.007% | +0.284% | 10,084 | 0% | -0.467% | -0.383% | N/A | 0% | -0.278% | -0.278% | N/A |
| key7 | 1,675 bytes | 60% | +0.106% | +0.709% | 3,098 | 0% | -0.567% | -0.460% | N/A | 0% | -0.557% | -0.557% | N/A |
| key8 | 1,675 bytes | 90% | +0.404% | +0.780% | 4,101 | 0% | -0.514% | -0.383% | N/A | 0% | -0.599% | -0.559% | N/A |
| key9 | 1,675 bytes | 90% | +0.220% | +0.711% | 13,817 | 0% | -0.383% | -0.307% | N/A | 0% | -0.599% | -0.559% | N/A |
| key10 | 1,675 bytes | 70% | +0.282% | +0.777% | 4,750 | 0% | -0.420% | -0.306% | N/A | 0% | -0.556% | -0.556% | N/A |

Fig. 3A

| File | Original Size | bzip2 | | | | gzip | | | | xz | | | |
|---|---|---|---|---|---|---|---|---|---|---|---|---|---|
| | | %Imp. | $\Delta_{avg}$ | $\Delta_{best}$ | $T_{best}$ | %Imp. | $\Delta_{avg}$ | $\Delta_{best}$ | $T_{best}$ | %Imp. | $\Delta_{avg}$ | $\Delta_{best}$ | $T_{best}$ |
| random1 | 2,048 bytes | 90% | +0.144% | +0.241% | 16,377 | 0% | -0.429% | -0.390% | N/A | 100% | +2.12% | +2.404% | 13,306 |
| random2 | 2,048 bytes | 40% | +0.024% | +0.543% | 8,145 | 10% | -0.416% | +0.325% | 8,145 | 100% | +4.16% | +4.492% | 9,122 |
| random3 | 2,048 bytes | 90% | +0.241% | +0.543% | 19,694 | 10% | -0.312% | +0.391% | 15,875 | 10% | -0.149% | +0.248% | 15,874 |
| random4 | 2,048 bytes | 20% | -0.199% | +0.302% | 8,161 | 20% | -0.201% | +0.715% | 26,789 | 100% | +2.727% | +2.871% | 1,256 |
| random5 | 2,048 bytes | 50% | +0.054% | +0.361% | 2,082 | 0% | -0.416% | -0.260% | N/A | 100% | +3.741% | +4.471% | 22,515 |
| random6 | 2,048 bytes | 100% | +0.331% | +0.781% | 16,321 | 10% | -0.280% | +0.780% | 16,321 | 100% | +4.222% | +4.481% | 2,956 |
| random7 | 2,048 bytes | 100% | +0.211% | +0.362% | 8,156 | 20% | -0.189% | +0.783% | 8,719 | 100% | -0.827% | +1.217% | 15,951 |
| random8 | 2,048 bytes | 80% | +0.228% | +0.541% | 9,248 | 0% | -0.429% | -0.325% | N/A | 0% | -0.247% | 0.000% | N/A |
| random9 | 2,048 bytes | 50% | +0.018% | +0.422% | 13,456 | 10% | -0.377% | -0.260% | 13,456 | 0% | -0.025% | 0.000% | N/A |
| random10 | 2,048 bytes | 60% | +0.017% | +0.421% | 1,876 | 0% | -0.324% | -0.259% | N/A | 100% | +0.538% | +0.733% | 3,790 |

Fig. 3B

| File | Original Size | bzip2 | | | | gzip | | | | xz | | | |
|---|---|---|---|---|---|---|---|---|---|---|---|---|---|
| | | %Imp. | $\Delta_{avg}$ | $\Delta_{best}$ | $T_{best}$ | %Imp. | $\Delta_{avg}$ | $\Delta_{best}$ | $T_{best}$ | %Imp. | $\Delta_{avg}$ | $\Delta_{best}$ | $T_{best}$ |
| ast500hr | 786 bytes | 70% | +0.389% | +1.296% | 1,340 | 0% | -1.733% | -1.556% | N/A | 0% | -1.186% | 0.000% | N/A |
| fs417 | 2,018 bytes | 70% | +0.177% | +1.027% | 1,787 | 0% | -0.762% | -0.684% | N/A | 0% | -0.571% | -0.357% | N/A |
| genetic | 1,873 bytes | 90% | +0.581% | +1.378% | 14,242 | 0% | -0.732% | -0.610% | N/A | 0% | -0.746% | -0.746% | N/A |
| mind6 | 3,216 bytes | 0% | -0.741% | -0.370% | N/A | 0% | -0.770% | -0.660% | N/A | 0% | -0.264% | -0.208% | N/A |
| unifid | 1,200 bytes | 0% | -1.581% | -1.581% | N/A | 0% | -1.649% | -1.461% | N/A | 0% | -1.439% | -1.439% | N/A |
| xargs | 4,227 bytes | 20% | -0.068% | +0.227% | 9,512 | 0% | -0.572% | -0.515% | N/A | 0% | -0.607% | -0.607% | N/A |
| goddard | 896 bytes | 0% | -0.968% | -0.538% | N/A | 0% | -1.288% | -0.947% | N/A | 0% | -1.203% | -0.633% | N/A |
| ast-dcrn | 2,613 bytes | 60% | +0.149% | +0.908% | 4,775 | 0% | -0.627% | -0.512% | N/A | 0% | -0.674% | -0.674% | N/A |
| ast-prog | 1,672 bytes | 20% | -0.361% | +0.425% | 12,091 | 0% | -0.785% | -0.664% | N/A | 0% | -0.440% | -0.400% | N/A |
| taxonomy | 3,271 bytes | 20% | -0.076% | +0.254% | 24,613 | 0% | -0.643% | -0.531% | N/A | 0% | -0.693% | -0.693% | N/A |

Optimization percentage for Basic start state

| | Max ($\Delta_{best}$) | Median | Mean ($\Delta_{avg}$) |
|---|---|---|---|
| bzip2 | 2.807775 | 1.068110 | 1.084995 |
| gzip | 1.034483 | 0.229973 | 0.286508 |
| lzma | 4.964539 | 0.264833 | 0.728740 |

Optimization percentage for Prime start state

| | Max ($\Delta_{best}$) | Median | Mean ($\Delta_{avg}$) |
|---|---|---|---|
| bzip2 | 6.250000 | 0.424779 | 0.459754 |
| gzip | 0.383142 | 0.084187 | 0.123636 |
| lzma | 4.705882 | 0.000000 | 0.582384 |

Optimization percentage for Fibonacci start state

| | Max ($\Delta_{best}$) | Median | Mean ($\Delta_{avg}$) |
|---|---|---|---|
| bzip2 | 2.083333 | 0.497516 | 0.360434 |
| gzip | 0.689655 | 0.082041 | 0.107272 |
| lzma | 4.705882 | 0.000000 | 0.554916 |

Fig. 5

METHOD OF COMPRESSING AND DECOMPRESSING A FILE VIA CELLULAR AUTOMATA PRE-PROCESSING

CROSS-REFERENCE TO RELATED APPLICATIONS

This nonprovisional patent application is a continuation of and claims priority to U.S. provisional Application No. 63/018,158, entitled "Method of compressing and decompressing a file via cellular automata pre-processing," filed on Apr. 30, 2020, by the same inventor.

BACKGROUND OF THE INVENTION

1. Field of the Invention

This invention relates, generally, to methods of file compression. More specifically, it relates to a file compression method that utilizes cellular automata pre-processing of a file to generate a new intermediary file between an original file and a compressed file, such that the intermediary file is more easily compressible than the original file, and such that the final compressed file is composed of the compressed intermediary file and instructions on how to transform the intermediary file, once decompressed, back to the original file.

2. Brief Description of the Prior Art

File compression methods are of growing importance in the era of big data, and are particularly required to facilitate the storage and transfer of data. Most text-based pre-processing compression techniques accomplish one or both of (1) reducing the size of the file to be compressed (such as by using a more efficient encoding); and (2) encoding information in a format that allows greater compression. Both goals are designed to reduce the size of the resulting compressed file. However, general compression algorithms are inefficient when used on random strings of characters within a file, because there are no sensible patterns to which the file can be easily reduced. For example, SSH keys (secure shell keys) are commonly used encryption keys that contain randomized data; as such, existing compression algorithms inefficiently compress and decompress SSH keys.

Attempts have been made to improve compression efficiencies by utilizing cellular automata methods. For example, Haukeli uses cellular automata (CA) to compress a "final state" file, working backwards from the final state to find a starting state. [1]. The final state must be identical to the original file, such that the starting state has a better compression ratio than the original file. If the starting state has a worse compression ratio than the original file, a new solution must be identified. As such, the Haukeli CA implementation requires an optimal solution to achieve compression efficiencies, since it requires a match between the final state and the original file. However, searching for an optimal solution uses a great deal of computing power, since many possible solutions must be presented and tested before a final solution is selected. In addition, not all final states are encodable by a CA, which means that not all files can be compressed using this method.

Accordingly, what is needed is a more efficient file compression method that can be used with common compression algorithms by creating an intermediary file that is easier to compress than an original file, without the need for an exact match between the original file and the compressed file. More specifically, what is needed is a more efficient file compression method that is accomplished by using cellular automata techniques to pre-process files to create the intermediary file, thereby improving compression speed and efficiency. However, in view of the art considered as a whole at the time the present invention was made, it was not obvious to those of ordinary skill in the field of this invention how the shortcomings of the prior art could be overcome.

While certain aspects of conventional technologies have been discussed to facilitate disclosure of the invention, Applicant in no way disclaims these technical aspects, and it is contemplated that the claimed invention may encompass one or more of the conventional technical aspects discussed herein.

The present invention may address one or more of the problems and deficiencies of the prior art discussed above. However, it is contemplated that the invention may prove useful in addressing other problems and deficiencies in a number of technical areas. Therefore, the claimed invention should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

BRIEF SUMMARY OF THE INVENTION

The long-standing but heretofore unfulfilled need for a method of compressing and decompressing a file using cellular automata to create an intermediary file and a final compressed file is now met by a new, useful, and nonobvious invention.

The novel method includes a step of identifying an optimal binary mask for an original file by executing a plurality of cellular automata processes. Each of the plurality of cellular automata processes having a set of instructions including a start state, a rule, and a number of iterations. After the plurality of cellular automata processes are executed, the method includes a step of selecting one of the plurality of cellular automata processes. The selected process is associated with a greatest degree of compression of the original file. In an embodiment, the optimal binary mask includes an associated length that is equal to a length of the original file.

The method includes a step of transforming, via the optimal binary mask, the original file into an intermediate file that is more compressible than the original file. In an embodiment, this step involves using a bitwise exclusive OR operation to subtract the optimal binary mask from the original file. The intermediate file is then compressed via a standard compression algorithm into a compressed intermediate file. In an embodiment, this step includes concatenating the set of instructions associated with the selected one of the plurality of cellular automata processes for the optimal binary mask with the compressed intermediate file.

The optimal binary mask is encoded as a set of instructions associated with the selected cellular automata process. As such, the optimal binary mask includes the set of instructions including the start state, the rule, and the number of iterations. The encoded optimal binary mask is then appended to the compressed intermediate file to form a final compressed file. In an embodiment, the encoded optimal binary mask is appended to a beginning end of the compressed intermediate file.

In an embodiment, the method includes a step of performing a decompression step on the final compressed file to decompress the final compressed file into the compressed intermediate file and the encoded optimal binary mask. Next, the optimal binary mask is recreated from the encoded optimal binary mask by utilizing the set of instructions associated with the selected one of the plurality of cellular automata processes. The compressed intermediate file can then by transformed, via the standard compression algorithm, into the intermediate file. The optimal binary mask is then used to transform the intermediate file into the original file. In an embodiment, this step is accomplished by applying a bitwise exclusive OR operation on each corresponding bit of the optimal binary mask and the intermediate file to recover the original file.

An embodiment of the compression and/or decompression method is implemented on one or more non-transitory computer-readable media having computer-executable instructions for performing a method of running a software program on a computing device, the computing device operating under an operating system, the method including issuing instructions from the software program.

An object of the invention is to improve compression and decompression efficiencies by creating an intermediate file using cellular automata, such that the intermediate file is compressed and decompressed, rather than searching for an optimal final state file to be compressed, thereby decreasing computing power used during compression.

These and other important objects, advantages, and features of the invention will become clear as this disclosure proceeds.

The invention accordingly comprises the features of construction, combination of elements, and arrangement of parts that will be exemplified in the disclosure set forth hereinafter and the scope of the invention will be indicated in the claims.

BRIEF DESCRIPTION OF THE DRAWINGS

For a fuller understanding of the invention, reference should be made to the following detailed description, taken in connection with the accompanying drawings, in which.

DETAILED DESCRIPTION OF THE INVENTION

In the following detailed description of the preferred embodiments, reference is made to the accompanying drawings, which form a part thereof, and within which are shown by way of illustration specific embodiments by which the invention may be practiced. It is to be understood that other embodiments may be utilized and process flow changes may be made without departing from the scope of the invention.

As used in this specification and the appended claims, the singular forms "a," "an," and "the" include plural referents unless the content clearly dictates otherwise. As used in this specification and the appended claims, the term "or" is generally employed in its sense including "and/or" unless the context clearly dictates otherwise.

The present invention includes a novel technique for pre-processing files that can improve file compression rates of existing general-purpose lossless file compression algorithms, particularly for files on which traditional algorithms perform poorly. The elementary cellular automata (CA) pre-processing technique involves finding an optimal CA state that can be used to transform a file into a format (i.e., an intermediate file) that is more amenable to compression than the original file format. This technique is applicable to multiple file types and may be used to enhance multiple compression algorithms. Evaluation on generated files, as well as samples selected from online text repositories, finds that the CA pre-processing technique improves compression rates by approximately 4% and shows promising results for assisting in compressing data that typically induce worst-case behavior in standard compression algorithms. The CA pre-processing technique (referred to herein as CAPP) will be described herein below.

The CAPP technique for pre-processing files improves the file compression rates of existing general purpose lossless file compression algorithms. This technique is applicable to multiple file types and may be used to enhance multiple compression algorithms. Evaluation on generated files, as well as samples selected from online text repositories, finds that the CAPP technique improves compression rates by 1-2% on average and up to 6%, and shows promising results for assisting in compressing data that typically induce worst-case behavior in standard compression algorithms. An overview of the CAPP method is shown in FIGS. 1A-1B.

Figure 1A:
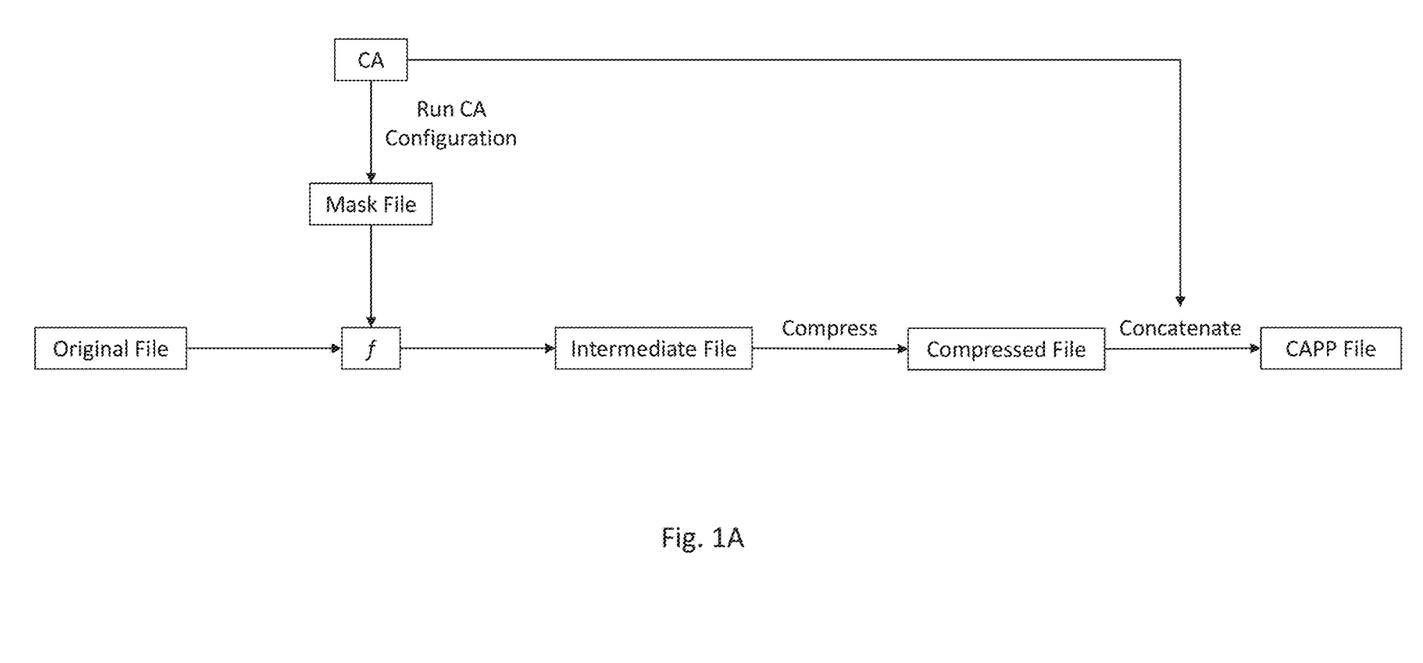
FIG. 1A is a process flow diagram showing a cellular automata file pre-processing method in accordance with an embodiment of the present invention, depicting the compression of files using cellular automata to create an intermediate file that is ultimately compressed and decompressed.

FIG. 1A shows an overview of the CAPP compression process. Given an original file to be compressed, a unique binary mask is created for that original file. The binary mask is then used to transform the original file into an intermediate file by using a bitwise XOR (bitwise exclusive OR) operation to subtract the mask from the original file. The intermediate file is compressed by a standard compression algorithm to form a compressed intermediate file, and an encoding of the binary mask is appended to the compressed intermediate file to form the final compressed file. Examples of standard compression algorithms are existing compression algorithms such as gzip, bzip2, and xz; however, it should be appreciated that alternative compression algorithms can be evaluated and incorporated into the method.

Figure 1B:
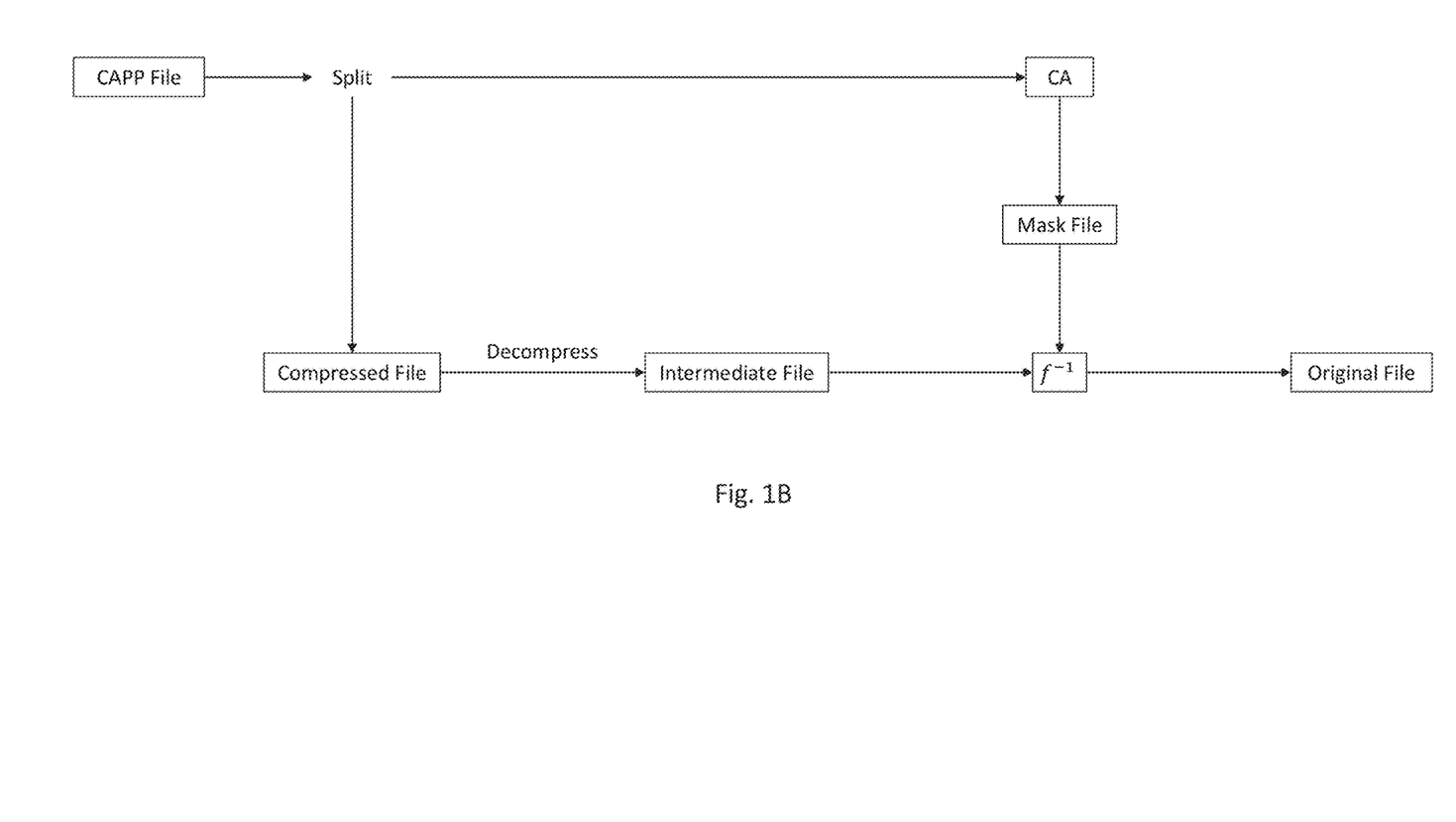
FIG. 1B is a process flow diagram showing a cellular automata file pre-processing method in accordance with an embodiment of the present invention, depicting the decompression of files using cellular automata to create an intermediate file that is ultimately compressed and decompressed.

FIG. 1B shows an overview of the CAPP decompression process. Given a final compressed file, the file is deconstructed into the compressed intermediate file and the encoding for the binary mask. The compressed intermediate file is decompressed into the intermediate file using the corresponding general decompression algorithm (e.g., gzip, bzip2, and xz). The encoding for the binary mask is used to run a cellular automata (CA) to generate the encoded binary mask. A bitwise XOR operation between the binary mask and the intermediate file is then used to recover the original file.

The Cellular Automata Encoded Mask

The key to the method is finding a mask that effectively transforms an original file into an intermediate file that has greater compression potential than the original file. In addition, the mask must be able to be stored efficiently with the compressed intermediate file so that it does not increase the size of the final compressed file size. The mask is a binary file of length L bits, where L is the length in bits of the original file. To store the mask efficiently, the method takes advantage of the fact that a CA provides a space efficient means of storing a complex pattern, such as the mask. A mask of any size can be encoded as a CA specification by saving three pieces of information: (1) a CA start state, (2) the number of iterations to run the CA, and (3) the CA rule to use in the CA iterations.

The start state is the first state of the CA. The start state is encoded as two integers, start_one and interval_one whose values are between 1 and L/5. The start state is a binary string of length L, consisting of all zero bits except for one bits that are placed in the following manner: the first one bit is placed at the index location specified by start_one, and the remaining one bits are placed at intervals of interval_one until the end of the string is reached.

The CA rule specifies how one state of a CA is transformed into a new state of the CA. The CA rule is applied once in each iteration or timestep of the CA, resulting in one state transformation in each iteration. There are 256 possible rules in an elementary CA. Each rule is identified by an integer ranging from zero to 255.

The number of iterations specifies the number of state transformations to execute in the CA. The final state of the CA is the mask that was being encoded by the given CA specification.

Figure 2:
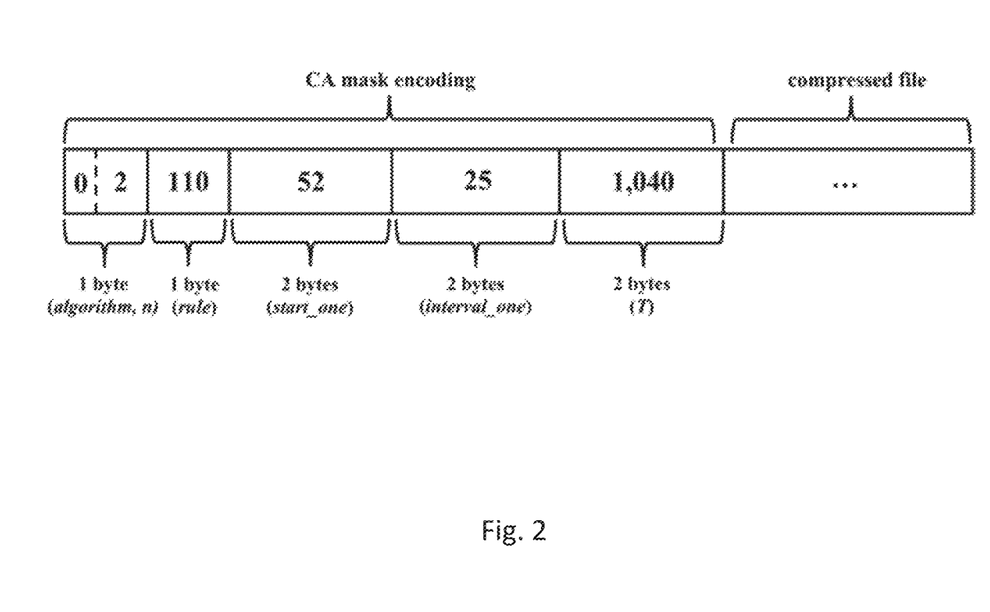
FIG. 2 depicts an example of the composition and format of a final compressed file generated by the algorithm described herein, in accordance with an embodiment of the present invention. The final compressed file includes the information needed to generate the cellular automata mask to create the intermediate file (leftmost five elements shown, labeled "CA mask encoding") appended to the compressed intermediate file generated from applying the specified compression algorithm to the intermediate file (rightmost element shown, labeled "compressed file").

An example of an encoding of a CA specification is shown in FIG. 2. The first 2 bits of the first byte indicate that the compression algorithm used is bzip2 (bzip2, gzip, and xz are represented by 0, 1, and 2, respectively). The last 6 bits of the first byte indicate the number of bytes that will be used to encode each of the following values: start one, interval one, and T. In this example, each will be represented by 2 bytes. The second byte indicates that the rule used in the CA was rule 110. The third and fourth byte show that the value of start one is 52. The fifth and sixth bytes show that the value of interval one is 25. Finally, the seventh and eighth bytes indicate that the value of T is 1,040. Using just these values, the CA that was used to generate the mask can be reconstructed and, thus, the mask encoded by these values can be created. The length of the CA mask encoding (in bytes) for a given file is given by the following equation:

$$E(L) = 3\left[\frac{1}{8}\log_2(4L)\right] + 2$$

where L is the size (in bits) of the file to be compressed.

Finding an Appropriate CA Mask

For each original file to be compressed, the CAPP method needs to find an appropriate mask in order to be able to enhance compression. The search of an appropriate mask for a given original file entails running multiple instances of a CA and checking each state of each CA run to evaluate its effectiveness in enhancing compression. The state that produces the best compression enhancement is the mask that is used and the CA start state, CA rule, and number of iterations to generate that state is used to encode that mask.

The process of searching for a CA mask includes the following steps. First, a random start state is generated by generating random values for start_one and interval_one between 1 and L/5. Using this start state, a CA is run using every CA rule for M iterations where M=4L, or until the CA states start repeating, whichever comes first. This results in a total of 256 different CA runs, since there are 256 different CA rules. Each of the M states from each of the 256 different CA runs is considered a candidate mask and is evaluated on its effectiveness as a mask. The state with the highest fitness is chosen to be the mask that CAPP uses to compress the given original file, and its CA specification (CA start state, CA rule, number of iterations) is saved.

Because in an elementary CA a cell can only interact with the two cells adjacent to it at each time step, it can take many time steps before each cell has interacted with every other cell. For this reason, M is set to be 4L, such that complex patterns in the rows (that could result in better file compression) are more likely to emerge after all cells have had a chance to interact with one another several times. A Bloom filter (Blustein and El-Maazawi 2002), a space-efficient probabilistic data structure composed of multiple hash tables of varying sizes, is used to detect whether a particular CA state has been seen before. This allows the method to terminate a CA search early if a cycle in the CA has been reached, significantly reducing the time required to run experiments in many cases.

Although the process of finding an appropriate mask for a given original file is time-intensive, once an appropriate mask has been identified, the process of compressing and decompressing a file is very fast.

Evaluating the Effectiveness of a Candidate Mask

The fitness of a candidate mask is evaluated as follows. Each candidate mask is used in the CAPP compression algorithm to compress an original file into a final compressed file. The standard compression method that was used in the CAPP algorithms is used to compress the original file directly to create the compressed original file. The fitness of a mask is the percent difference between the final compressed file and the compressed original file This process is executed using each of the compression algorithms tested (gzip, bzip2, and xz), and the best solution is used to specify the fitness of the mask. Once an optimal binary mask is identified, the mask can be reused to compress and decompress the file over multiple iterations, so long as the file does not change. If the file changes, a new optimal binary mask must be identified using the processes described in detail above, and can be reused again so long as the file does not change.

Results

The performance of the CA pre-processing technique is evaluated by comparing the compression performance of the standard compression algorithms with the compression performance of these algorithms with CA pre-processing. As noted above, during the experimental research, the compression algorithms used were gzip, bzip2, and xz.

Figure 3A:
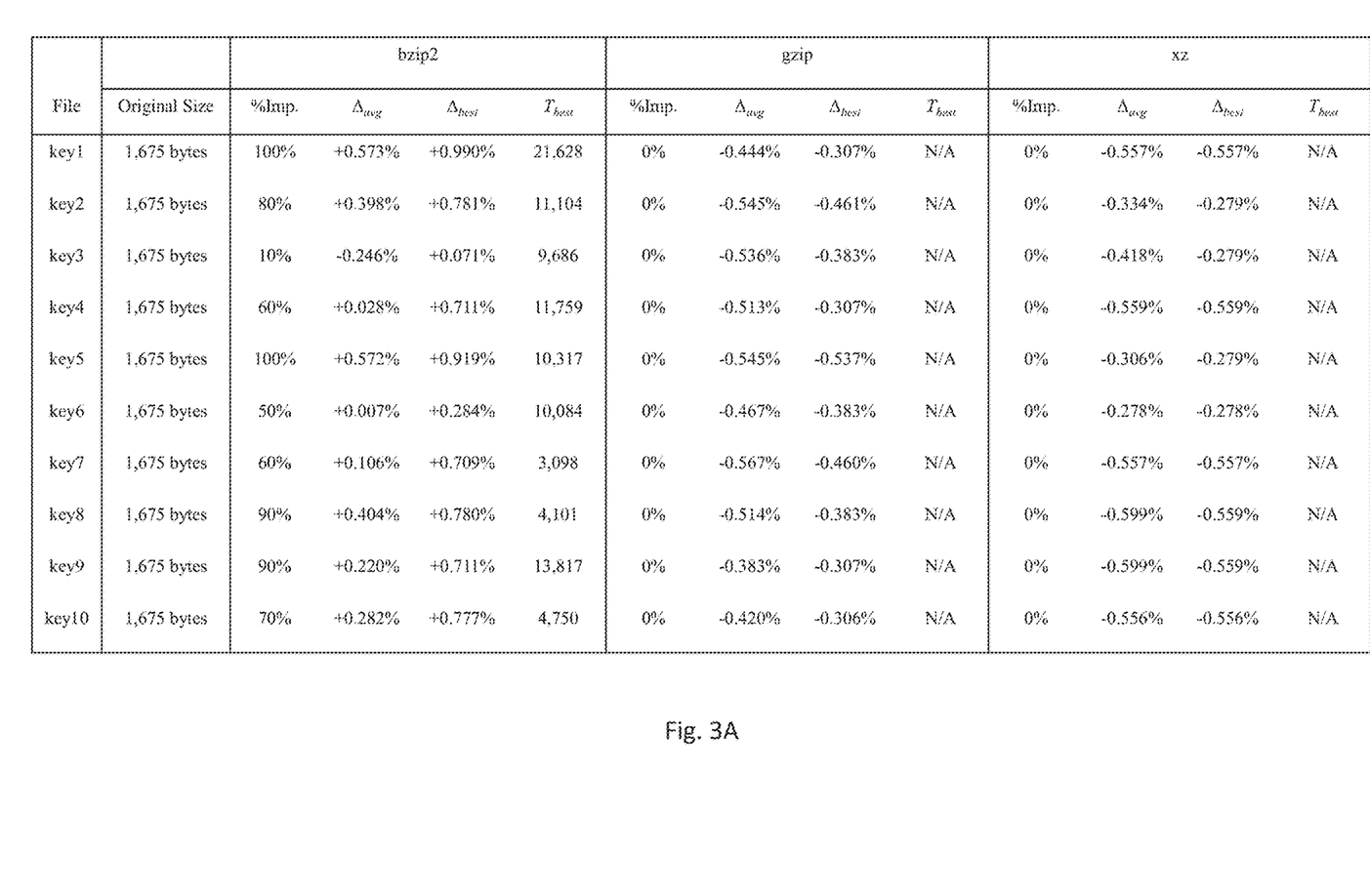
FIG. 3A is a table comparing improvement results related to the method of FIGS. 1A-1B, showing comparative improvement for standard compression algorithms for ten SSH keys.
Figure 3B:
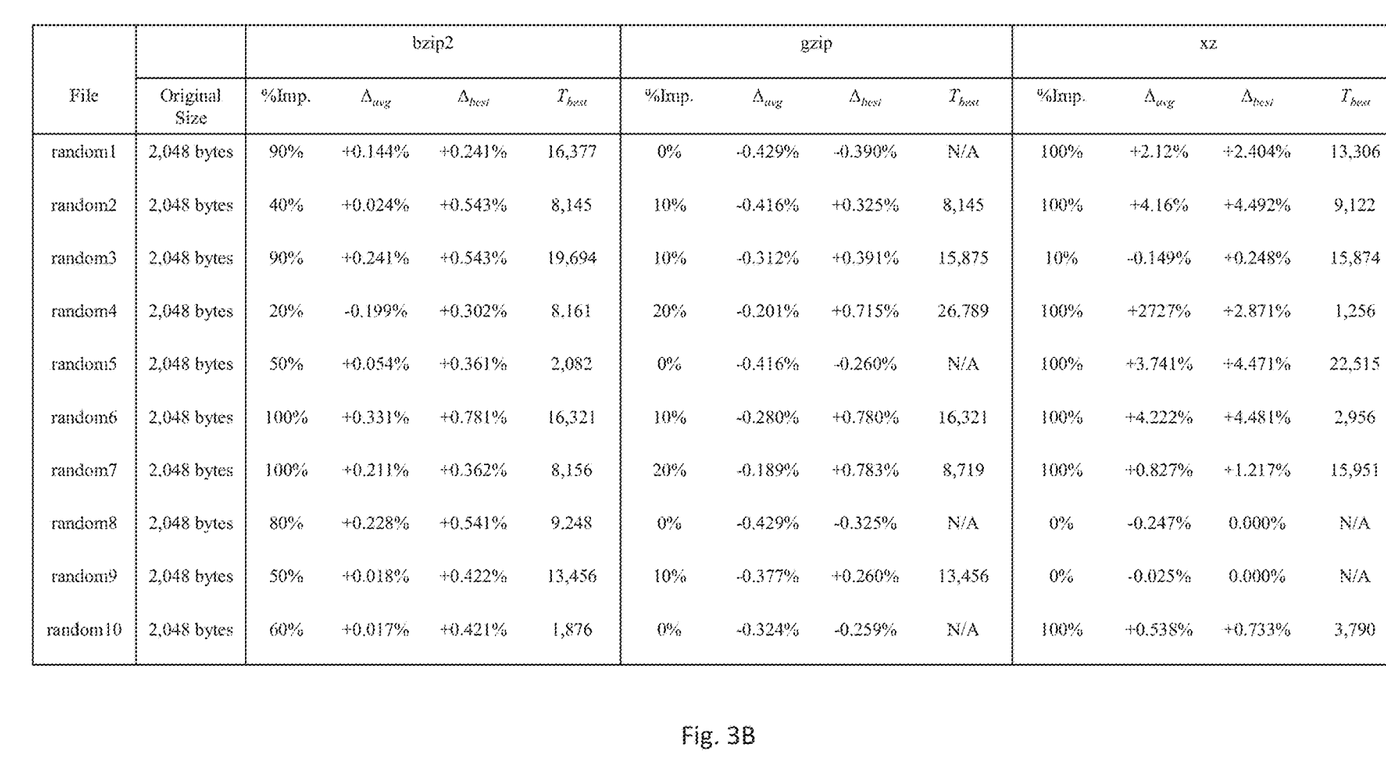
FIG. 3B is a table comparing improvement results related to the method of FIGS. 1A-1B, showing comparative improvement for standard compression algorithms for ten randomized text files.
Figure 3C:
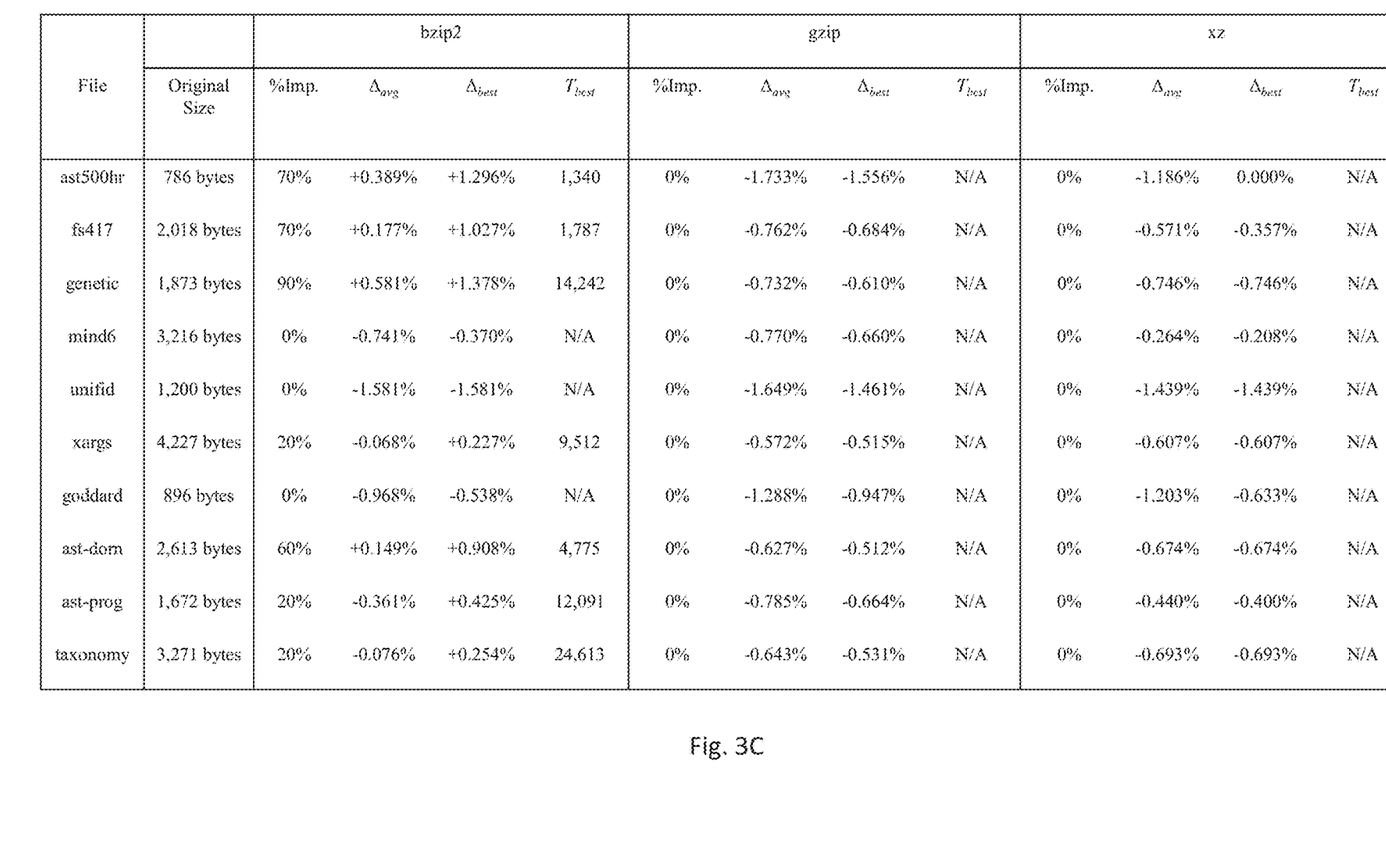
FIG. 3C is a table comparing improvement results related to the method of FIGS. 1A-1B, showing comparative improvement for standard compression algorithms for ten non-randomized text files.

The files on which experiments were performed are provided in FIGS. 3A-3C. The first group of files (key1 through key10, shown in FIG. 3A) are SSH keys (stored as text files); the second group files (random1 through random10, shown in FIG. 3B) are randomly generated text files containing numbers and lowercase/uppercase letters; and the last group of files are files selected from online text repositories (shown in FIG. 3C). For the last grouping of files in FIG. 3C, all are text files, with the exception of mind6, which is an ASC file. The xargs file comes from the Canterbury Corpus benchmark, and the rest of the files in this group come from the Science section of textfiles.com, an online text repository. File sizes range from 0.7 KB to 4.2 KB. For each file, the CA is run with 10 different randomly generated start states (by randomly choosing the values of start_one and interval_one), and for each run the best compression improvement for each of the compression algorithms is stored. The results of these trials are averaged to give the average compression improvement for each file.

As shown in FIGS. 3A-3C, % Imp. is a value representing the percentage of trials (out of the 10 that are run for each file) in which the methods disclosed herein result in a net positive effect on compression. The results reported take into account the extra length that the CA mask encoding adds. Out of the algorithms tested, bzip2 is the most responsive when looking at the % Imp. measurement. Aggregating across groups of files, the disclosed method improves bzip2 compression in 69.5% of trials for the random files tested (both the SSH keys in FIG. 3A and the randomly generated text files in FIG. 3B) and in 35% of trials for the non-random files tested (in FIG. 3C). In many cases, compression improvements are found, but these improvements are outweighed by the length of the CA mask encoding. If the length of the CA mask encoding that is added to the compressed file is ignored, compression improvements are found in 66.6% of trials overall, compared with 28.1% when taking the encoding into account.

Also as shown in FIGS. 3A-3C, $\Delta_{avg}$ is the average percent improvement in compression when using the disclosed method compared with using the standard compression algorithm alone, and $\Delta_{best}$ is the best percent of improvement in compression for any individual trial. When looking at these measurements, the xz algorithm shows the most promising results. For the randomly generated text files compressed with the xz algorithm, the disclosed method shows improvements of up to 4.492%. The bzip2 algorithm also shows promising results in this aspect. For most of the files compressed with bzip2, using the disclosed method results in a net improvement in compression, although these improvements are typically 1% or less.

FIGS. 3A-3C also show the time-step at which the best individual compression improvement is found, represented by $T_{best}$ (the value of T when $\Delta_{best}$ is found). A value of N/A indicates that no CA masks are found that improved compression. Interestingly, values of $T_{best}$ as high as 26,000 are observed, showing that the CA masks being generated are generally non-trivial.

When analyzing the improvement that the disclosed method yields for each of the algorithms tested, it is found that the compression improvement the disclosed method offers has an inverse relationship with the compression ratio of the standard compression algorithm for the file being tested. For example, for most of the files tested, the gzip algorithm produces the best compression; however, the disclosed method shows poor results when used with the gzip compared to the other algorithms. This relationship also seems to hold true from file-to-file when using the same algorithm. Files that, when compressed, have lower compression ratios seem to respond better to the pre-processing technique of the disclosed method. The SSH keys and randomly generated text files exhibit this behavior.

Figure 4:
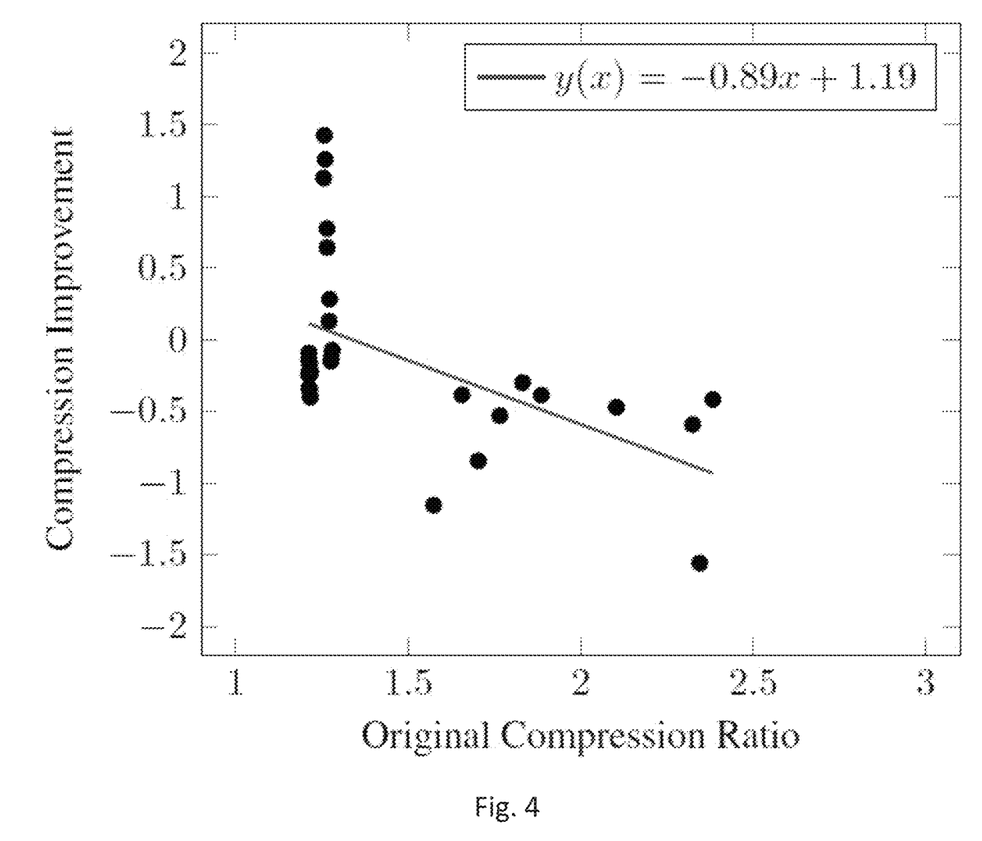
FIG. 4 is a graphical representation of the relationship between the compression ratio of the original file and the compression improvement gained using the cellular automata pre-processing method.

In addition, typically, standard compression algorithms perform poorest on random-like data like these files; this holds true for the files tested as well. These random-like files also show the highest and most consistent improvements when using the disclosed pre-processing method compared to the non-random files. This relationship is shown in FIG. 4. For each file and compression algorithm pairing, the original compression ratio (without using the disclosed method) and the compression improvement when using the disclosed method are plotted. As shown in FIG. 4, there is a general trend downward as compression ratio increases. Thus, the disclosed method could have intriguing implications for compressing random-like data and other types of data that typically induce worst-case behavior in standard compression algorithms.

Figure 5:
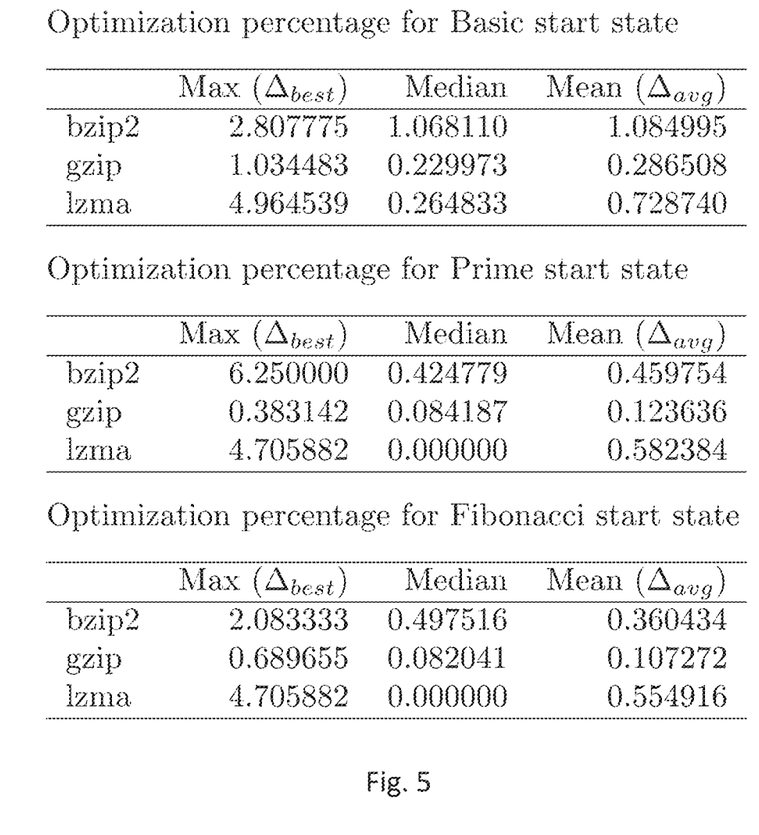
FIG. 5 is table showing results from a second set of experiments investigating the performance of the method of FIGS. 1A-1B using different standard compression methods.

FIG. 5 shows results from a second set of experiments investigating the performance of the CAPP method. These experiments were performed on the same corpus as the results shown in FIGS. 3A, 3B, and 3C. These experiments differ from the experiments in FIGS. 3A, 3B, and 3C in two ways: (1) with respect to the standard compression algorithms tested, xz was replace by lzma, and (2) instead of defining the start state using randomly generated start_one and interval_one values, three fixed start states were used.

The Basic start state is a sequence of L zero bits with a single one bit at bit location L/2. The Prime start state is a sequence of L zero bits with one bits at locations that correspond to prime numbers. The Fibonacci start state if a sequence of L zero bits with one bits at locations that correspond to the Fibonacci Series.

As shown in FIG. 5, in this second set of experiments, the CAPP method achieves optimization percentages as high as 6.25% with mean optimization percentages ranging from approximate 0.1% to 1.1%. The results indicated that performance appears to be best when using bzip2 as the standard compression algorithm.

Conclusion

Unlike previous methods which operate at the character and word level, the CA operates at the bit level. As a result, the disclosed CA method can be generalized to multiple file types beyond just text files. The disclosed CA pre-processing method was used to enhance gzip, bzip2, and xz compression results on randomly generated text files, SSH keys, and selected files from online text repositories. A small range of file sizes were tested due to the computation necessary to explore the massive search space available. Initial results show that, in many cases, the disclosed CA method improves compression, with some results showing up to a 4% improvement compared to the standard compression algorithm. However, if the disclosed CA method cannot find an effective CA mask, compression efficiencies can be reduced. The disclosed CA method provides the most benefit on random files which are the cases where the standard compression algorithm performs the worst, and can be used to improve the worst-case performance of widely used compression algorithms.

Hardware and Software Infrastructure Examples

The present invention may be embodied on various computing platforms that perform actions responsive to software-based instructions and most particularly on touchscreen portable devices. The following provides an antecedent basis for the information technology that may be utilized to enable the invention.

The computer readable medium described in the claims below may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any non-transitory, tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. However, as indicated above, due to circuit statutory subject matter restrictions, claims to this invention as a software product are those embodied in a non-transitory software medium such as a computer hard drive, flash-RAM, optical disk or the like.

Program code embodied on a computer readable medium may be transmitted using any appropriate medium, including but not limited to wireless, wire-line, optical fiber cable, radio frequency, etc., or any suitable combination of the foregoing. Computer program code for carrying out operations for aspects of the present invention may be written in any combination of one or more programming languages, including an object oriented programming language such as Java, C#, C++, Visual Basic or the like and conventional procedural programming languages, such as the "C" programming language or similar programming languages.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

It should be noted that when referenced, an "end-user" is an operator of the software as opposed to a developer or author who modifies the underlying source code of the software. For security purposes, authentication means identifying the particular user while authorization defines what procedures and functions that user is permitted to execute.

REFERENCES

[1] Haukeli, M. 2012. Lossless data compression using cellular automata. Computer Science.
[2] Blustein, J., and El-Maazawi, A. 2002. Bloom filters—a tutorial analysis, and survey. Technical report, Dalhousie University.
[3] Weissten, E. W. Cellular automaton. Math World—A Wolfram Web Resource. Located at http://mathworld.wolfram.com/CellularAutomaton.html.

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

The advantages set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

What is claimed is:

1. A computing device implemented method for compressing a file via cellular automata pre-processing of Hall the file, the method comprising the steps of:

identifying, via a processor of a computing device, an optimal binary mask for an original file by executing a plurality of cellular automata processes, each of the plurality of cellular automata processes having a set of instructions including a start state, a rule, and a number of iterations, and selecting one of the plurality of cellular automata processes;

via the optimal binary mask, transforming the original file into an intermediate file that is more compressible than the original file;

via a standard compression algorithm implemented by the processor of the computing device, transforming the intermediate file into a compressed intermediate file;

encoding, via the processor of the computing device, the optimal binary mask as a set of instructions associated with the selected one of the plurality of cellular automata processes, such that the optimal binary mask includes the set of instructions including the start state, the rule, and the number of iterations; and appending, via the processor of the computing device, the encoded optimal binary mask to the compressed intermediate file to form a final compressed file, wherein the selected one of the plurality of cellular automata processes is associated with a greatest degree of compression of the original file.

2. The method of claim 1, wherein the optimal binary mask includes an associated length that is equal to a length of the original file.

3. The method of claim 1, wherein the step of transforming the original file into the intermediate file further comprises the step of using a bitwise exclusive OR operation to subtract the optimal binary mask from the original file.

4. The method of claim 1, wherein the step of transforming the compressed intermediate file into the final compressed file comprises the step of concatenating the set of instructions associated with the selected one of the plurality of cellular automata processes for the optimal binary mask with the compressed intermediate file.

5. The method of claim 1, wherein the step of appending the encoded optimal binary mask to the compressed intermediate file includes the step of appending the encoded optimal binary mask to a beginning end of the compressed intermediate file.

6. The method of claim 1, further comprising the step of performing a decompression step on the final compressed file to decompress the final compressed file into the compressed intermediate file and the encoded optimal binary mask.

7. The method of claim 6, further comprising the step of recreating, via the set of instructions associated with the selected one of the plurality of cellular automata processes, the optimal binary mask from the encoded optimal binary mask.

8. The method of claim 7, further comprising the step of transforming, via the standard compression algorithm, the compressed intermediate file into the intermediate file.

9. The method of claim 8, further comprising the step of transforming, via the optimal binary mask, the intermediate file into the original file.

10. The method of claim 9, further comprising the step of applying a bitwise exclusive OR operation on each corresponding bit of the optimal binary mask and the intermediate file to recover the original file.

11. A computing device implemented method for compressing a file via cellular automata pre-processing, decompressing the file via cellular automata pre-processing, or both, the method comprising the steps of:

identifying, via a processor of a computing device, an optimal binary mask for an original file by executing a plurality of cellular automata processes, each of the plurality of cellular automata processes having a set of instructions including a start state, a rule, and a number of iterations, and selecting one of the plurality of cellular automata processes;

compressing, via the processor of the computing device, the original file by:

via the optimal binary mask, transforming the original file into an intermediate file that is more compressible than the original file;

compressing the intermediate file;

encoding the optimal binary mask as a set of instructions associated with the selected one of the plurality of cellular automata processes, such that the optimal binary mask includes the set of instructions including the start state, the rule, and the number of iterations; and appending the encoded optimal binary mask to the compressed intermediate file to form a final compressed file; and decompressing, via the processor of the computing device, the final compressed file by:

decompressing the final compressed file into the compressed intermediate file and the encoded optimal binary mask;

recreating, via the set of instructions associated with the selected one of the plurality of cellular automata processes, the optimal binary mask from the encoded optimal binary mask;

decompressing the compressed intermediate file into the intermediate file; and transforming, via the optimal binary mask, the intermediate file into the original file, wherein the selected one of the plurality of cellular automata processes is associated with a greatest degree of compression of the original file.

12. The method of claim 11, wherein the optimal binary mask includes an associated length that is equal to a length of the original file.

13. The method of claim 11, wherein the step of transforming the original file into the intermediate file further comprises the step of using a bitwise exclusive OR operation to subtract the optimal binary mask from the original file.

14. The method of claim 11, wherein the step of transforming the compressed intermediate file into the final compressed file comprises the step of concatenating the set of instructions associated with the selected one of the plurality of cellular automata processes for the optimal binary mask with the compressed intermediate file.

15. The method of claim 11, wherein the step of appending the encoded optimal binary mask to the compressed intermediate file includes the step of appending the encoded optimal binary mask to a beginning end of the compressed intermediate file.

16. The method of claim 11, wherein the step of transforming the intermediate file into the original file further comprises the step of applying a bitwise exclusive OR operation on each corresponding bit of the optimal binary mask and the intermediate file to recover the original file.

17. One or more non-transitory computer-readable media having computer-executable instructions for performing a method of running a software program on a computing device, the computing device operating under an operating system, the method including issuing instructions from the software program comprising:

identifying an optimal binary mask for an original file by executing a plurality of cellular automata processes, each of the plurality of cellular automata processes having a set of instructions including a start state, a rule, and a number of iterations, and selecting one of the plurality of cellular automata processes, the optimal binary mask including an associated length that is equal to a length of the original file;

via the optimal binary mask, transforming the original file into an intermediate file that is more compressible than the original file by using a bitwise exclusive OR operation to subtract the optimal binary mask from the original file;

via a standard compression algorithm, transforming the intermediate file into a compressed intermediate file;

encoding the optimal binary mask as a set of instructions associated with the selected one of the plurality of cellular automata processes, such that the optimal binary mask includes the set of instructions including the start state, the rule, and the number of iterations; and appending the encoded optimal binary mask to the compressed intermediate file to form a final compressed file, wherein the selected one of the plurality of cellular automata processes is associated with a greatest degree of compression of the original file.

18. The media of claim 17, wherein the step of transforming the compressed intermediate file into the final compressed file comprises the step of concatenating the set of instructions associated with the selected one of the plurality of cellular automata processes for the optimal binary mask with the compressed intermediate file.

19. The media of claim 17, wherein the step of appending the encoded optimal binary mask to the compressed intermediate file includes the step of appending the encoded optimal binary mask to a beginning end of the compressed intermediate file.

20. The media of claim 17, further comprising decompressing the final compressed file to the original file by:
 decompressing the final compressed file into the compressed intermediate file and the encoded optimal binary mask;
 recreating, via the set of instructions associated with the selected one of the plurality of cellular automata processes, the optimal binary mask from the encoded optimal binary mask;
 decompressing the compressed intermediate file into the intermediate file; and
 transforming, via the optimal binary mask, the intermediate file into the original file.

* * * * *